US008736383B2

(12) United States Patent
Acar et al.

(10) Patent No.: US 8,736,383 B2
(45) Date of Patent: May 27, 2014

(54) POWER AMPLIFIER CIRCUIT AND CONTROL METHOD

(71) Applicant: NXP B. V., Eindhoven (NL)

(72) Inventors: Mustafa Acar, Eindhoven (NL); Mark Pieter van der Heijden, 's-Hertogenbosch (NL)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 13/742,534

(22) Filed: Jan. 16, 2013

(65) Prior Publication Data

US 2013/0187713 A1 Jul. 25, 2013

(30) Foreign Application Priority Data

Jan. 19, 2012 (EP) .................................... 12151787

(51) Int. Cl.
*H03F 3/04* (2006.01)
(52) U.S. Cl.
USPC ............................ 330/311; 330/310; 330/277
(58) Field of Classification Search
USPC ......................................... 330/311, 310, 277
See application file for complete search history.

(56) References Cited

U.S. PATENT DOCUMENTS

| 7,145,370 B2 * | 12/2006 | Bernard et al. ............... 327/112 |
| 7,932,622 B2 * | 4/2011 | Chiozzi et al. ................ 307/9.1 |
| 7,948,809 B2 * | 5/2011 | Miki ........................ 365/189.09 |
| 8,093,924 B2 * | 1/2012 | Kamenicky et al. .......... 327/108 |
| 2005/0285684 A1 | 12/2005 | Burgener et al. |
| 2007/0075784 A1 * | 4/2007 | Pettersson et al. ............ 330/311 |
| 2010/0226411 A1 * | 9/2010 | Watanabe et al. ............. 375/130 |
| 2013/0106507 A1 * | 5/2013 | Signoff et al. ............ 330/124 R |

FOREIGN PATENT DOCUMENTS

GB 2 456 066 A 7/2009

OTHER PUBLICATIONS

Mazzanti, A., et al.; "Analysis of Reliability and Power Efficiency in Cascode Class—E PAs"; IEEE J. of Solid-State Circuits; pp. 1222-1229 (May 2006).
Sowlati, Tirdad, et al.; "A 2.4-GHz 0.18 µm CMOS Self-Biased Cascode Power Amplifier"; IEEE J. of Solid-State Circuits, vol. 38, No. 8; pp. 1318-1324 (Aug. 2003).
Heck, S., et al.; "A High-Power Dual-Gate GaN Switching-Amplifier in the GHz-Range"; IEEE 12th Annual Wireless and Microwave Techn. Conference; pp. 1-4 (Apr. 18, 2011).
Apostolidou, M., et al.; "A 65nm CMOS 30 dBm Class-E RF Power Amplifier With 60% PAE and 40% PAE at 16 dB Back-Off"; IEEE J. Solid-State Circuits; IEEE Service Center, Piscataway, NJ, US; vol. 44, No. 5; 4 pages (May 1, 2009).
Extended European Search Report for application 12151787.4 (May 24, 2012).

* cited by examiner

*Primary Examiner* — Patricia Nguyen

(57) ABSTRACT

A power amplifier circuit uses an output transistor and a cascode transistor. First and second drive circuits apply gate control signals to the two transistors, which rise and fall in synchronism, and this is such that the voltage drop across the cascode transistor is reduced (compared to a constant gate voltage being applied to the output transistor).

13 Claims, 2 Drawing Sheets

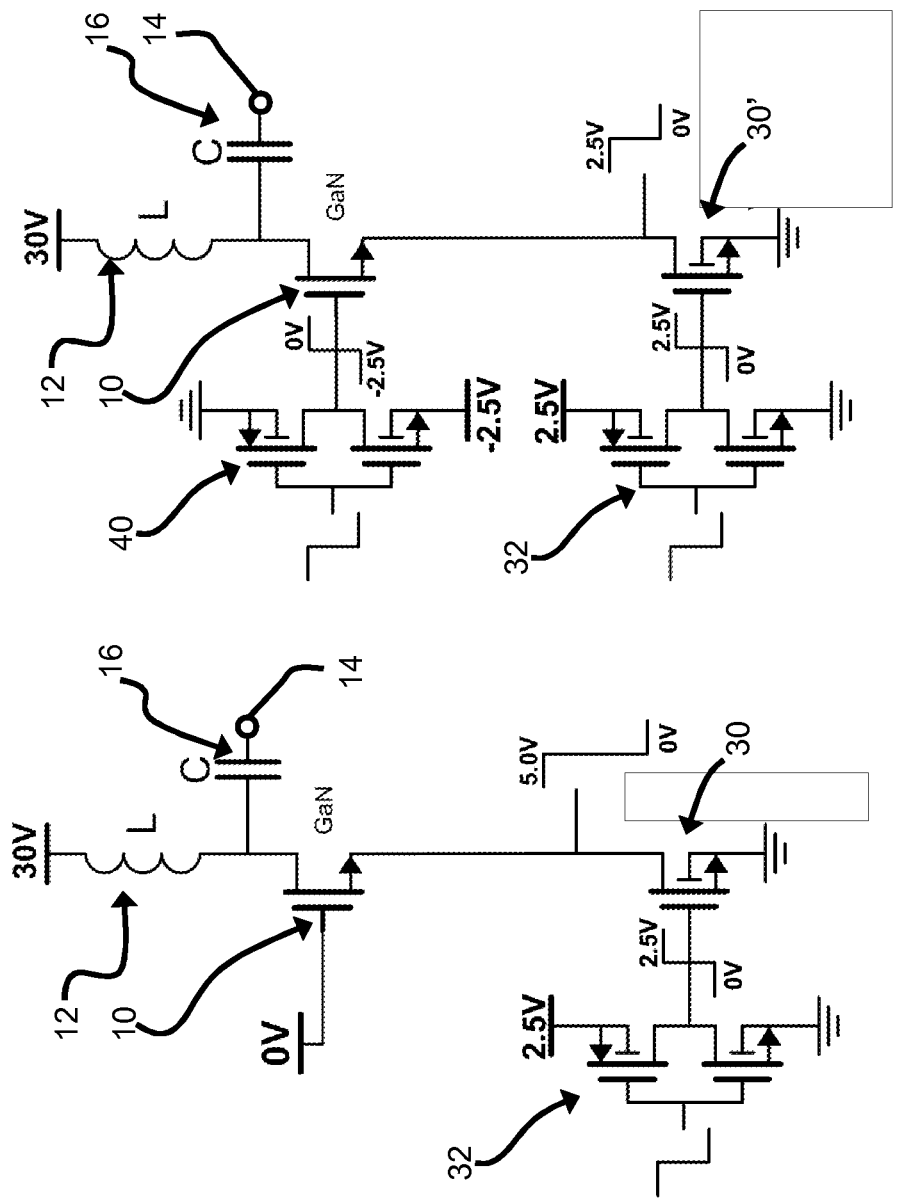

POWER AMPLIFIER CIRCUIT AND CONTROL METHOD

CROSS-REFERENCE TO RELATED APPLICATIONS

This application claims the priority under 35 U.S.C. §119 of European patent application no. 12151787.4, filed on Jan. 19, 2012 the contents of which are incorporated by reference herein.

This invention relates to power amplifier circuits, particularly RF amplifier circuits, and particularly but not exclusively using Gallium Nitride output transistors.

Gallium Nitride (GaN) HEMTs (High Electron Mobility Transistors) are the next generation of RF power transistor technology that offers the unique combination of higher power, higher efficiency and wider bandwidth than competing GaAs and Si based technologies.

GaN is primarily offered on silicon (Si), silicon carbide (SiC), and sapphire substrates. GaN HEMTs are depletion mode devices, meaning a negative gate voltage (compared to the source voltage) and gate-drain bias sequencing is required for proper operation. The circuits to implement these functions are analagous to GaAs FET circuits.

GaN technology is increasing in popularity due to better RF performance (lower capacitance and higher breakdown voltage) in comparison to LDMOS for advanced Power Amplifier systems, for example switch-mode amplifiers.

Driving a GaN power transistor for a switch-mode power amplifier is a challenge for a number of reasons. A high voltage swing is required for the control circuits, of approximately 5V. This results from the gate-source threshold voltage of around −5V. Negative voltage biasing is also required. Square wave driving with small rise/fall times is also required if duty-cycle control is to be implemented.

Using another transistor to drive the GaN output transistor in a cascode configuration is a common solution to drive GaN transistors. Standard cascoding requires high breakdown voltage cascode transistors in addition to the GaN power transistor. High breakdown voltage transistors require extra process steps or special dedicated expensive technologies.

There is therefore still a need for a GaN power transistor drive circuit which can be implemented with low voltage transistors.

The article "A High-Power Dual Gate GaN Switching Amplifier in the GHz Range" of S. Beck et. al., Wireless and Microwave Technology Conference, 2011 IEEE 12th annual, XP0319471557 discloses an amplifier output stage having two stacked transistors in series, with voltage distribution across the transistors.

According to the invention, there is provided a power amplifier circuit, and control method as defined in the claims.

The first and second drive circuits can apply two-level gate control signals which are in phase or 180 degrees out of phase—in each case with their transitions between levels in synchronism.

By using two drive circuits, when the cascode transistor is turned off, the voltage across the cascode transistor can be reduced, by reducing the voltage on the gate of the output transistor. The fixed gate-source threshold voltage couples this voltage drop to the cascode transistor.

This arrangement eliminates the need for high breakdown-voltage cascode transistors. Thus, it is possible to drive the GaN output transistor by using low-cost, low-breakdown voltage transistors.

The reduced voltage stress on the drain-source of the cascode transistor for example enables the use of CMOS technology instead of special high-breakdown transistor technologies (e.g. GaAs etc).

The circuit is preferably for amplifying an RF input signal.

The source of the output transistor can be connected to the drain of the cascode transistor, and the voltage swing applied to the gate of the output transistor is coupled by the gate-source voltage to the drain of the cascode transistor, thereby reducing the drain-source voltage of the cascode transistor when it is turned off.

The first drive circuit can comprise a first CMOS inverter circuit, for providing an output between first and second voltage rails. The first and second voltage rails of the first CMOS inverter circuit can comprise 0V and a value between 2V and 3V, such as 2.5V.

The second drive circuit can comprise a second CMOS inverter circuit, for providing an output between third and fourth voltage rails. The third and fourth voltage rails of the second CMOS inverter circuit can comprise 0V and a value between −2V and −3V, such as −2.5V.

An inductor is preferably in series with the output transistor and the cascode transistor, with the inductor, the output transistor and the cascode transistor in series between the power lines. This enables amplification above the upper voltage rail voltage to be achieved, in particular up to 4 times the upper voltage rail.

An example of the invention will now be described in detail with reference to the accompanying drawings, in which:

FIG. 2 shows a second example of known GaN amplifier circuit; and

FIG. 3 shows an example of GaN amplifier circuit of the invention.

Figure 1:
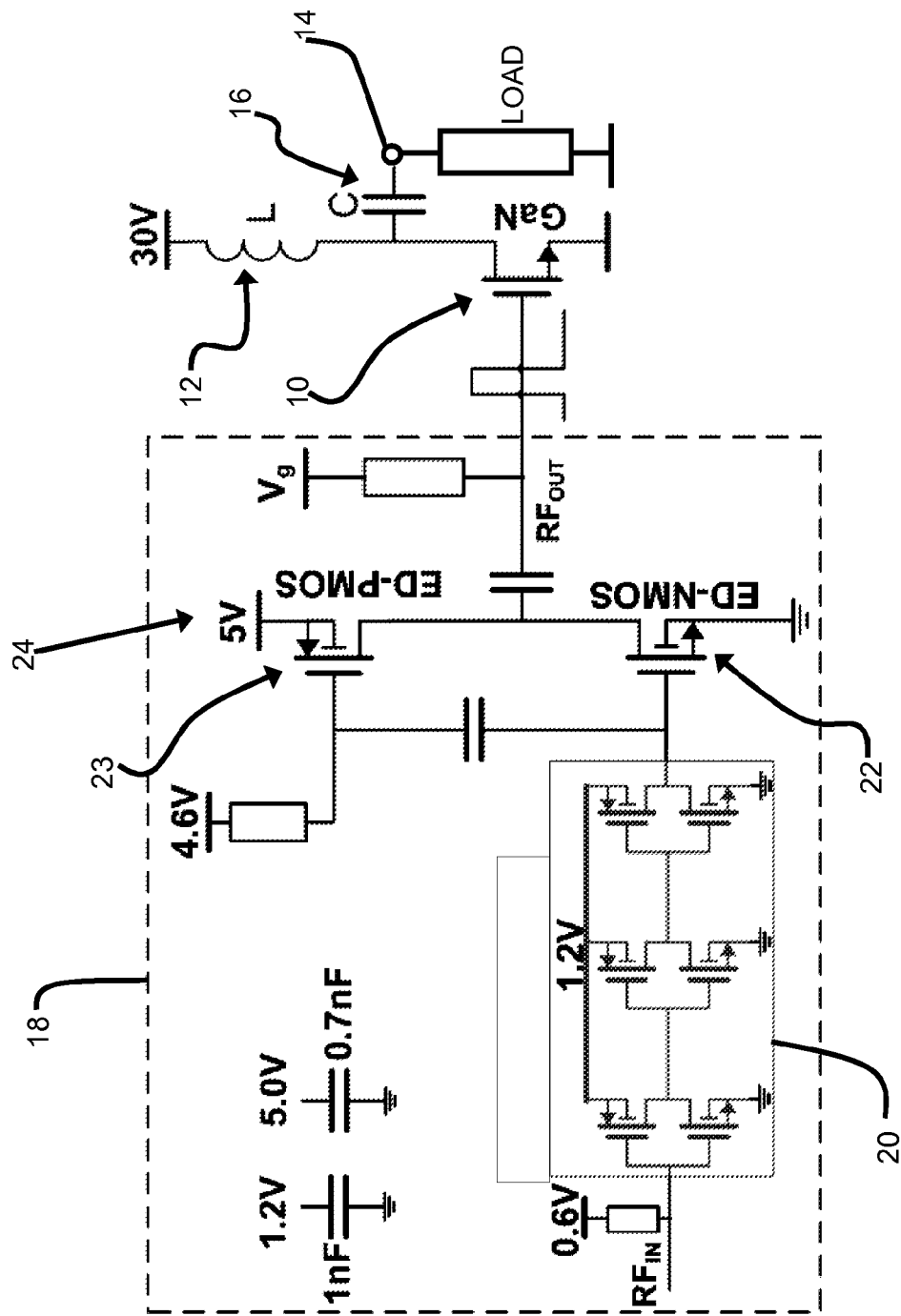
FIG. 1 shows a first example of known GaN amplifier circuit.

The invention provides a power amplifier circuit using a GaN output transistor and a cascode transistor. A first drive circuit is for controlling the signal applied to the gate of the cascode transistor in dependence on an input signal and a second drive circuit is for controlling the signal applied to the gate of the output transistor in dependence on the input signal. The first and second drive circuits apply gate control signals which rise and fall in synchronism, and this is such that the voltage drop across the cascode transistor is reduced (compared to a constant gate voltage being applied to the output transistor).

This approach eliminates the need for high breakdown voltage transistors, so that GaN transistors can be driven using low-cost, low-breakdown voltage transistors.

FIG. 1 shows a first example of known RF GaN amplifier circuit.

The circuit comprises a GaN output transistor 10 in series with an inductor 12, between power rails, shown as 30V and ground. The output of the circuit 14 is coupled to an output capacitor 16.

The circuit operates by modulating the DC current flowing through the inductor, and function as a class E power amplifier.

A drive circuit 18 controls the signal applied to the gate of the GaN output transistor 10.

The RF input signal $RF_{IN}$ is applied to a CMOS inverter chain 20 with 1.2V and 0V power rails, which is used to drive the pull-down n-type transistor 22 of an output inverter 24. This output inverter needs to deliver a 5V swing, and thus has 5V and 0V power rails. The pull-up p-type transistor 23 of the output inverter is biased on by the 4.6V rail shown.

A DC gate bias circuit of a gate voltage Vg and coupling resistor 48 is coupled to the output of the drive circuit. This is a negate voltage bias, for example of −3V.

This circuit requires a high voltage swing (of 5V) and a high negative voltage bias. The high voltage swing requires use of high voltage control transistors, such as ED-MOS (ED=extended drain) transistors, and also requires both n-type and p-type devices.

The circuit also requires capacitors with high values (for example capacitors are needed which are at least 10 times larger than the gate source capacitance of the transistor). Implementing such large capacitors operating at RF frequencies is a challenge. Generally, the large size capacitors are designed as a parallel connection of unit cells. An important reason for the decrease in self-resonance frequency and quality factor when upscaling the capacitors is parasitic inductance and resistance due to metals connecting the unit cells.

FIG. 2 shows a second example of known GaN amplifier circuit.

In this circuit, the output transistor 10 is in series with a cascode transistor 30.

By "in series" in respect of transistors is meant that the source-drain path of one is in series with the source-drain path of the other. Thus, the drain/source of the top transistor is connected to the top rail, the source/drain of the top transistor is connected to the drain/source of the bottom transistor and the source/drain of the bottom transistor is connected to the bottom rail.

The output transistor can have its gate held at a constant zero voltage.

The transistor 10 is a depletion device with a negative threshold voltage, for example of −5V. Thus at the turn-off of the output transistor, the source voltage will be 5V. For a source voltage below 5V the output transistor is turned on.

This −5V gate-source threshold voltage means the cascode transistor 30 needs to be able to withstand a 5V drain-source voltage, so again it cannot be formed as a low voltage CMOS transistor, but is instead implemented as an ED-MOS transistor.

The cascode transistor is controlled by a control circuit 32 in the form of a CMOS inverter circuit, with 2.5V and 0V rails as shown. The CMOS inverter circuit receives the RF input signal as its input.

When the gate control signal for the cascode transistor 30 is high (2.5V), the cascode transistor is turned on, which pulls the drain down to 0V. Thus the output transistor 10 is also turned on, and current is drawn through the inductor.

When the gate control signal for the cascode transistor 30 is low (0V), the cascode transistor is turned off. The drain voltage is dictated by the previously-on output transistor 10. The voltage rises to 5V as the output transistor 10 turns off. Both transistors 10,30 are then turned off but there is a 5V drain-source voltage across the cascode transistor. The inductor current flows to the output through the output capacitor 16.

The output voltage can vary between 0 and 60V (double the high power rail) for a linear power amplifier. For a non-linear switch mode power amplifier, the output voltage can vary up to four times the high power rail.

This circuit has the advantage of around 40% less area compared to the circuit of FIG. 1. It does not require ac capacitors, and can be implemented with the larger devices all n-type.

The output voltage of the circuit shared by the drain-source voltage of the NMOS transistor and the drain-source voltage of the GaN transistor in the cascode approach, whereas in the conventional approach (of FIG. 1), the GaN transistor drain-source voltage is the full output voltage.

However, the cascode circuit still requires a high voltage cascode transistor as a result of the 5V source-drain voltage explained above.

FIG. 3 shows an example of GaN amplifier circuit of the invention.

The circuit adds a control circuit for controlling the gate voltage of the output transistor 10 to the circuit of FIG. 2, and the same reference numerals are used for the same components in FIG. 2. The repeated components share the same functions. In the circuit of FIG. 3, the cascode transistor is shown as 30'. It performs the same function as the cascode transistor 30 but it can be implemented as a low voltage CMOS device. The cascode transistor and the main output transistor are again in series (as explained above).

The added control circuit 40, for controlling the gate voltage of the output transistor 10 comprises another CMOS inverter. It is also controlled by the RF input, so that the outputs of the two control circuits 32,40 are in synchronism and in phase, i.e. and they rise and fall together. The voltage rails for the second control circuit 40 are 0V and −2.5V.

When the gate control signal for the cascode transistor 30' is high (2.5V), the cascode transistor is turned on, which pulls the drain down to 0V. At the same time, the gate of the output transistor is pulled high to 0V. Thus the output transistor 10 is also turned on, and current is drawn through the inductor in exactly the same way as for the circuit of FIG. 2.

When the gate control signal for the cascode transistor 30' is low (0V), the cascode transistor is turned off. The drain voltage is dictated by the previously-on output transistor 10. However, the gate voltage has been pulled down to −2.5V. The voltage thus only rises to 2.5V as the output transistor 10 turns off, when the gate-source voltage of the output transistor reaches −5V. Both transistors 10,30 are again turned off and the inductor current flows to the output through the output capacitor 16.

The additional control circuit thus avoids the need for the gate-source threshold voltage of the GaN transistor to be present across the cascode transistor The driver circuit of FIG. 3 thus reduces the voltage stress on the drain-source of the cascode transistor enabling low-cost, high-speed, low breakdown voltage transistor technologies (e.g. CMOS) instead of special high-breakdown transistor technologies (e.g. GaAs etc).

The invention can be used for example in the design of power amplifiers for base station applications. However, many other application are possible.

In the example shown, the two control circuit 32,40 are in phase. They could instead be 180 degrees out of phase, for example if one transistor is p-type and the other is n-type. The control signals still fall and rise in synchronism, although one signal may fall when the other rises. The main output transistors can be n-type, p-type or a mixture.

The invention is of particular interest for GaN output transistors. However, the invention can be applied to other transistor technology types, for example LDMOS transistors, and again enables a low voltage cascode transistor and low voltage control transistors to be used in combination with a higher voltage output transistor.

The control circuits are shown as CMOS inverters, but non-inverting buffers could equally be used, or indeed other level control circuits.

Various modifications will be apparent to those skilled in the art.

The invention claimed is:
1. A power amplifier circuit, comprising:
an output transistor;

a second transistor, with the output transistor and the cascode transistor in series between power lines;

a first drive circuit for controlling the signal applied to the gate of the cascode transistor in dependence on an input signal;

a second drive circuit for controlling the signal applied to the gate of the output transistor in dependence on the input signal;

wherein the first and second drive circuits apply gate control signals which have transitions in synchronism; and wherein the output transistor comprises an n-type GaN transistor or LDMOS transistor and the second transistor comprises a lower voltage NMOS transistor.

2. A circuit as claimed in claim 1, wherein the first drive circuit comprises a first CMOS inverter circuit, for providing an output between first and second voltage rails.

3. A circuit as claimed in claim 2, wherein the first and second voltage rails of the first CMOS inverter circuit comprise 0V and a value between 2V and 3V.

4. A circuit as claimed in claim 3, wherein the first and second voltage rails of the first CMOS inverter circuit comprise 0V and approximately 2.5V.

5. A circuit as claimed in claim 1, wherein the second drive circuit comprises a second CMOS inverter circuit, for providing an output between third and fourth voltage rails.

6. A circuit as claimed in claim 5, wherein the third and fourth voltage rails of the second CMOS inverter circuit comprise 0V and a value between −2V and −3V.

7. A circuit as claimed in claim 6, wherein the first and second voltage rails of the second CMOS inverter circuit comprise 0V and approximately −2.5V.

8. A circuit as claimed in claim 1, further comprising an inductor in series with the output transistor and the second transistor, with the inductor, the output transistor and the second transistor in series between the power lines.

9. A method of controlling a cascode amplifier circuit comprising an n-type GaN or LDMOS output transistor and a second, lower voltage NMOS transistor, with the output transistor and the cascode transistor in series between power lines, the method comprising:

controlling a signal applied to a gate of the cascode transistor in dependence on an input signal;

controlling a signal applied to the gate of the output transistor in dependence on the input signal;

wherein controlling the first and second drive circuits comprises applying gate control signals which have transitions in synchronism, thereby to limit the drain-source voltage across the cascode transistor when it is turned off.

10. A method as claimed in claim 9, wherein controlling the signal applied to the gate of the second transistor comprises operating a first CMOS inverter circuit, for providing an output between first and second voltage rails.

11. A method as claimed in claim 10, wherein the first and second voltage rails of the first CMOS inverter circuit comprise 0V and a value between 2V and 3V.

12. A method as claimed in claim 9, wherein controlling the signal applied to the gate of the output transistor comprises operating a second CMOS inverter circuit, for providing an output between first and second voltage rails.

13. A method as claimed in claim 12, wherein the first and second voltage rails of the second CMOS inverter circuit comprise 0V and a value between −2V and −3V.

* * * * *